United States Patent [19]

Liu et al.

[11] Patent Number: 5,217,949
[45] Date of Patent: Jun. 8, 1993

[54] SUPERCONDUCTORS

[75] Inventors: Ru-Shi Liu; Robert Janes; Wuzong Zhou; Peter P. Edwards, all of Cambridge, England

[73] Assignee: Lynxvale Limited, Cambridge, England

[21] Appl. No.: 685,637

[22] Filed: Apr. 16, 1991

[30] Foreign Application Priority Data

Apr. 19, 1990 [GB] United Kingdom ............... 9008753

[51] Int. Cl.$^5$ ............................................. H01B 12/00
[52] U.S. Cl. ..................................... 505/1; 505/776; 505/779; 505/781; 505/783
[58] Field of Search .................. 505/1, 776, 779, 781, 505/783; 501/134; 252/62-63

[56] References Cited

U.S. PATENT DOCUMENTS

| | | | |
|---|---|---|---|
| 4,942,152 | 7/1990 | Itozaki et al. | 505/1 |
| 4,980,339 | 12/1990 | Setsune et al. | 505/1 |
| 5,004,720 | 4/1991 | Kobayashi et al. | 505/1 |
| 5,015,621 | 5/1991 | Takemura | 505/1 |
| 5,021,398 | 6/1991 | Sharma et al. | 505/1 |
| 5,028,585 | 7/1991 | Spencer | 505/1 |
| 5,036,044 | 7/1991 | Hermann et al. | 505/1 |

OTHER PUBLICATIONS

"Superconductivity in $Tl_{1.5}SrCaCu_2O_x$", Nagashima et al., *Japanese Journal of Applied Physics*, vol. 27, No. 6, Jun. 1988, pp. L1077–L1079.

"Superconductivity in the Tl–Sr–Ca–Cu–O System", Z. Z. Sheng et al. vol. 38, No. 10: *Physical Review B*, Oct. 1, 1988, pp. 7074–7076.

"Bulk Superconductivity up to 122 K in the Tl–Pb–Sr–Ca–Cu–O System", M. A. Subramanian, C. C. Torardi et al., *Reports* Oct. 14, 1988, pp. 249–252.

"$Tl_{1-x}Pb_xCaSr_2Cu_2O_7$: Another 1122 High-$T_c$ Superconductor", A. K. Ganguli et al., *Physica C* 156 (1988) pp. 788–790, North Holland, Amsterdam.

"A New High-$T_c$ Superconducting Tl–Pb–Ca–Sr–Cu–O System": R. S. Liu et al., *Physica C* 156 (1988) pp. 791–794, North-Holland, Amsterdam.

"The Superconducting $(Tl,Pb)Sr_2CaCu_2O_7$ and $(Tl,Pb)Sr_2CaCu_3O_9$: Neutron Powder Diffraction, High Resolution Electron Microscopy and X-Ray Absorption Studies", J. B. Paries et al., *Physica C* 159 (1989) pp. 245–254, North-Holland, Amsterdam.

"A New High-$T_c$ Superconductor Containing Thallium and its Crystal Structure: The 1212: Phase $(Tl_{1-x}Bi_x)_{1.33}Sr_{1.33}Ca_{1.33}Cu_2O_{6.67+\partial}$", *Journal of Superconductivity*, P. Haldar et al., vol. 1, No. 2, 1988, pp. 211–218.

"Preparation and Superconducting Properties of $(Tl,Bi)Sr_2CaCu_2O_y$", Shu Li et al. *Physica C* 157 (1989), pp. 365–369.

"Synthesis and Superconducting Properties of $(Tl_{1-x}Bi_x)Sr_2Ca_2Cu_3O_9$", M. A. Subramanian et al., *Mat. Res. Bull.*, vol. 25, pp. 101–106, 1990.

"Superconductivity Above 77 K in the R-Tl-Sr-Ca-Cu-O System (R Represents Rare Earths)", Z. Z. Sheng et al., *Physical Review B.*, vol. 39, No. 4, 1 Feb. 1989, pp. 2918–2920.

"Superconducting (1:1:2:2)–Type Layered Cuprates of the Formula $TlCa_{1-x}L_xSr_2Cu_2O_y$ (L=Y or a Rare-Earth Element)", C. N. R. Rao et al., *Physical Review B*, vol. 40, No. 4, Aug. 1, 1989, pp. 2565–2567.

(List continued on next page.)

*Primary Examiner*—Mark L. Bell
*Assistant Examiner*—Alan Wright
*Attorney, Agent, or Firm*—Oliff & Berridge

[57] ABSTRACT

Superconducting materials of the (Tl,In)-Sr-Ca-Cu-O system-type are modified to raise their critical temperatures by substituting an element M for part of the Tl/In and optionally substituting Y or a rare earth element for some of the Ca.

M is a transition metal with valency electrons in d orbitals in its normal state and having accessible tri-and/or tetra-valent states, that is V, Ti, Cr, Zr, Nb, Hf or Ta (which are preferred) Mn, Fe, Co, Ni, Mo, Rh, W, Os, Ir, Re or Ru.

8 Claims, 6 Drawing Sheets

OTHER PUBLICATIONS

"The Fabrication and Characterization of Superconducting Tl-Pb-Ca-Pr-Sr-Cu-O Compounds with $Y_1Ba_2Cu_3O_y$-like Structure and $T_c$ (Zero) Up to 106 K", R. S. Liu et al., *Physica C* 159 (1989), pp. 385-390.

"Bulk Superconductivity with T (zero) up to 95 K in a $Tl_{0.5}Pb_{0.5}Ca_{0.9}Ce_{0.1}Sr_2Cu_2$ Oxide with an $Y_1Ba_2Cu_3O_y$-like Structure", P. T. Wu et al., *Appl. Phys. Lett.* 54(24), Jun. 12, 1989, pp. 2464-2466.

"Superconductivity with $T_{c(zero)}$ above 105 K in Tl--containing Septenary Oxides with $Y_1Ba_2Cu_3O_y$-like Structure", J. M. Liang, et al., *Physica C* 165 (1990), pp. 347-353.

"Bulk Superconductivity of the $(Tl_{0.5}Bi_{0.5})(C_{1-x}Y_x)Sr_2Cu_2O_y$ System", Y. T. Huang et al., *Japanese Journal of Applied Physics* vol. 28, No. 9, Sep. 1989, pp. L 1514-L 1517.

"Superconductivity and the Metal-Semiconductor Transition in the Septenary Oxide System,$(Tl_{0.5}Pb_{0.5})(Ca_{1-x}Y_y)Sr_2Cu_2O_{7-\partial}$", R. S. Liu et al., *Journal of Solid State Chemistry*, 86, pp. 334-339 (1990).

"Model Family of High-Temperature Superconductors: $Tl_mCa_{n-1}Ba_2Cu_nO_{2(n+1)+m}$ (m=1,2; n=1,2,3)", S. S. Parkin et al., *Physical review B*, vol. 38, No. 10, 1 Oct. 1988, pp. 6531-6537.

"Superconductor-to-Insulator Transition in the $Bi_2Sr_{3-x}Y_xCu_2O_{8+y}$ System", M. A. Subramanian et al., *Journal of Solid State Chemistry* 77, pp. 196-199 (1988).

"Spin Resonance of $V^{2+}$, $V^{3+}$, $V^{4+}$ in $\alpha$-$Al_2O_3$", John Lambe et al., *Physical review* vol. 118, No. 1, Apr. 1, 1960, pp. 71-77.

"Chromium Provides Boose to Thallium Superconductor", p. 2—*Superconductor Week*, Feb. 4, 1991.

"Superconductivity in $Tl_{1.5}SrCaCu_2Ox$", Nagashima et al., *Japanese Journal of Applied Physics* vol. 27, No. 6, Jun. 1988, pp. L1077-L1079.

"Resistive, Magnetic, and Structural Studies of $Tl_{0.5}Pb_{0.5}(Ca_{1-x}M_x)Sr_2Cu_2O_y$ Compounds with M Equal to the Natural Mixture of Rare-Earth Elements", R. S. Liu et al., *Applied Phys. Lett.* 55(19), Nov. 6, 1989, pp. 2029-2031.

"The Fabrication and Characterization of Superconducting $Tl_{0.5}Pb_{0.5}(Ca_{1-x}M_x)Sr_2Cu_2O_y$ Compounds with M=Mischmetal", R. S. Liu et al., *Japanese Journal of Applied Physics*, vol. 28, No. 7, Jul., 1989, pp. L1179-L1181.

"Rietveld Refinement of the Structure of $TlSr_2CaCu_2O_7$ by X-Ray Powder Diffraction Data", Doi et al., *Japanese Journal of Applied Physics*, vol. 29, No. 1, Jan. 1990, pp. L57-L59.

"First Exaple of Indium As a Practical Alternative to Thallium in High-$T_c$ Superconductors", *Physica C*, 1990, 111-114, North-Holland.

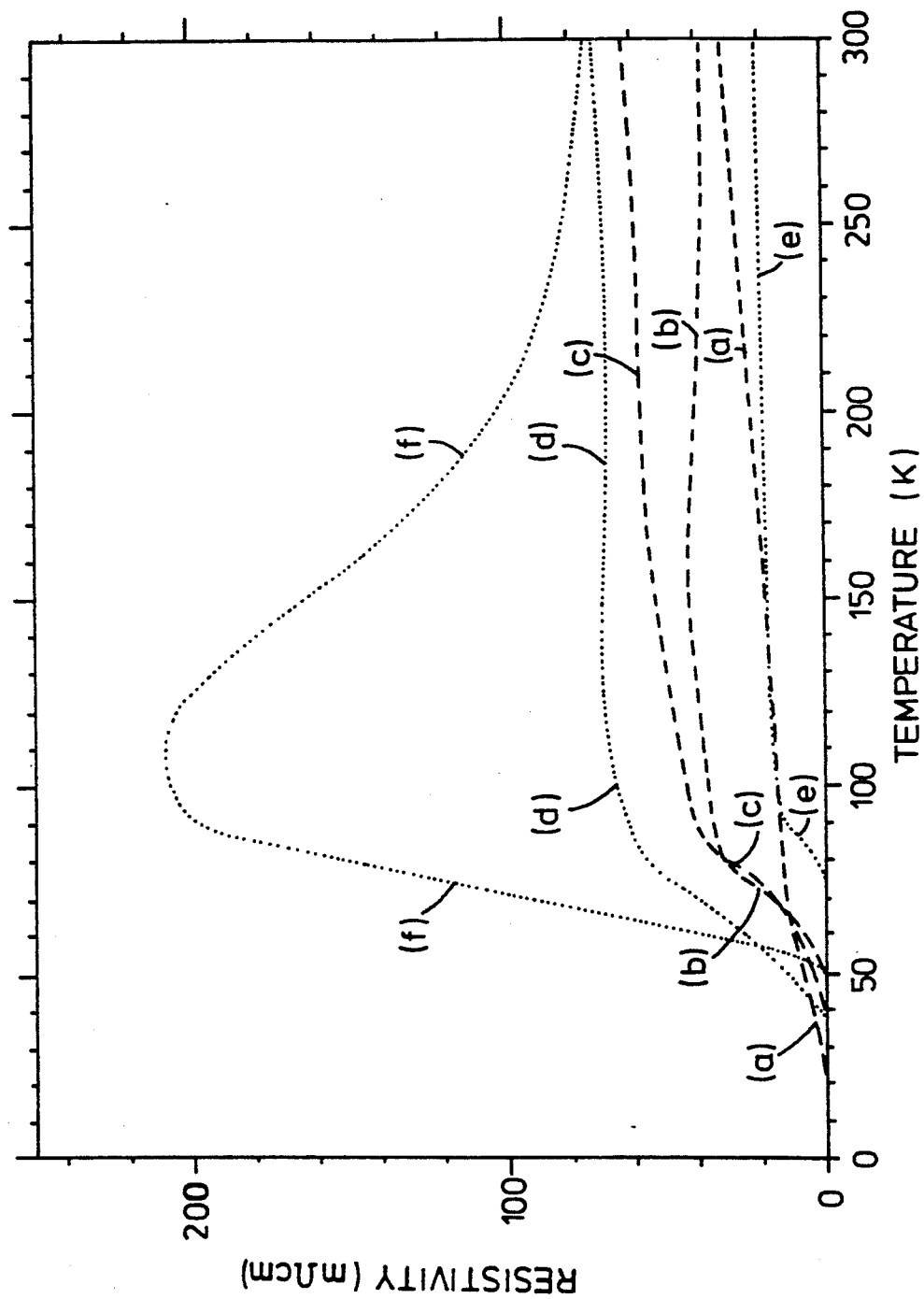

SUPERCONDUCTORS

This invention relates to superconductors.

The discovery of superconductivity in the Tl-Sr-Ca-Cu-O system (Nagashima, T. et. al., Jpn. J. Appl. Phys. 27, L1077–L1079 (1988); Sheng, Z. Z. et al. Phys.Rev. B38 7074–7076 (1988)) has led to the identification of two series of related superconducting cuprates. One has the formula $(Tl_{0.5}M_{0.5})$ $Sr_2Ca_{n-1}Cu_nO_{2n+3}$, where M=Pb (Subramanian, M. A. et al., Science 242, 249–252 (1988); Ganguli, A. K., Nanjundaswamy D. S. & Rao, C. N. R. Physcia C 156, 788–790 (1988).; Liu, et al. Physica C 156, 791–794 (1988); Parise, J. B. et al., Physica C 159, 245–254 (1989), or M=Bi (Haldar, P. et al. J. Supercond. 1, 211–218 (1988); Li, S. & Greenlbatt, M. Physica C 157, 365–369 (1988); Subramanian, M. A., Gai, P.L. & Sleight, a. W. Mat. Res. Bull. 25, 101–106 (1990)); and n=2 or 3. The other has the formula $TlSr_2(Ca_{x-1}R_x)_{n-1}Cu_nO_{2n+3}$, where (R=La or, Nd and Y and n=2 and $0<x<1$) (Sheng, Z. Z., Sheng, L., Fei, X. & Hermann, A. M. Phys.Rev. B39 2918–2920 (1989); Rao, C. N. R., Ganguli, A. K. & Vijayaraghavan, R. Phys.Rev. B40, 2565–2567 (1989). The n=2 and n=3 series in these materials have superconducting transition temperatures ($T_c$) up to about 85K and 120K, respectively.

Recently, there have been reports (Liu et al. Physica C 159, 385–390 (1989); Wu, P. T. et al, Appl. Phys.Lett. 54, 2464–2466 (1989); Liang, J. M. et al. Physica C 165, 347–353 (1990); Huang, Y. T., Liu, R. S., Wang, W. N. & Wu, P. T., Jpn. J. Appl. Phys.28, L1514–L1517 (1989); Liu, R. S. et al, J. Solid State Chem. Vol 86 p 334–339 (1990)) of bulk superconductivity up to 110K in the $(Tl_{0.5}M_{0.5})$ $Sr_2(Ca_{0.8}R_{0.2})Cu_2O_{7-delta}$ system, where (M=Pb or Bi, R=Y or a rare earth element. Significantly, this latter system has a $T_c$ some 20–25K above those of the other cuprate systems having the so-called 1-2-1-2 structure, e.g. $TlBa_2CaCu_2O_7$ (Parkin, S. S. P. et al. Phys. Rev. B38 6531–6537 (1988)), $(Tl_{0.5}Pb_{0.5})$ $Sr_2CaCu_2O_y$ (Subramanian, M. A. et al. Science 242, 249–252 (1988)), and $TlSr_2(Ca,Y)Cu_2O_y$ (Sheng, Z. Z., Sheng, L., Fei, X. & Hermann, A. M. Phys. Rev. B39 2918–2920 (1989); Rao, C. N. R., Ganguli, A. K. & Vijayaraghavan, R. Phys. Rev. B40, 2565–2567 (1989). The oxidation states of Pb ions substituted into the Tl sites in these materials have been established to be 4+ and Bi ions may be either 3+ or 4+ or a mixture of these.

The present invention involves the modification of Tl-Sr-Ca-Cu-O systems by the partial substitution of Tl by an element M which is a transition metal with valency electrons in d orbitals in its normal state and having with accessible tri- and/or tetravalent states and in which In may be substituted for part or all of the remaining Tl. Further, part or all of the Ca may be replaced by an element M' where M' is Y or a rare earth element.

The element M may be Ti, V, Cr, Mn, Fe Co, Ni, Zr, Nb, Mo, Ru, Rh, Hf, Ta, W, Re, Os and Ir; metals with not more than five d electrons in the valency shell, that is to say Ti, V, Cr, Zr, Nb, Mo, Hf, Re and W are preferred.

The following Example illustrates the invention, with reference to the accompanying drawings in which:

FIG. 6 is a graph plotting resitivity as a function of temperature for a further group of superconducting compositions in accordance with the invention.

EXAMPLE 1

Samples with nominal compositions of $TlSr_2CaCu_2O_y$, $(Tl_{0.5}V_{0.5})$ $Sr_2CaCu_2O_y$ and $(Tl_{0.5}V_{0.5})$ $Sr_2(Ca_{0.8}Y_{0.2})Cu_2O_y$ were prepared by solid state reaction from stoichiometric mixtures of high purity $Tl_2O_3$, $V_2O_5$, $SrO_2$, CaO, $Y_2O_3$ and/or CuO powders, as appropriate. The powders were weighed, mixed and pressed into pellets with dimensions of 10 mm diameter and 2 mm thick using a pressure of 5 tonne/cm². The pellets were then wrapped with gold foil to alleviate loss of thallium during subsequent heat treatment. The sample was then sintered at 950° C. for 3 hours in flowing oxygen and then cooled to room temperature at a rate of 5° C./min. After heat treatment, all the samples were dense and black. Bar-shaped samples (1.5 mm×2 mm×8 mm) were cut from the sintered pellets and used subsequently for resistivity and magnetic measurements.

A standard four-point probe method was used for electrical resistivity measurements, and was fully automated for data acquisition. The electrical contacts to the sample were made by fine copper wires with a conductive silver paint, the temperature being recorded by a calibrated silicon diode sensor located close to the sample. Magnetisation data was obtained using a superconducting quantum interference device (SQUID) magnetometer (Quantum Design), field-cooled (FC) dc magnetisation being measured in an applied field of 100 gauss. X-ray diffraction (XRD) studies were carried out with Copper-K-alpha radiation using a Spectrolab CPS-120 diffractometer. Variant chemical compositions were examined by energy dispersive X-ray spectrometry (EDS) in a Jeol JEM-200CX electron microscope. Molybdenum specimen grids were used and background spectra were studied to ensure that no copper signals were detected from the sample-free area. Freshly-prepared monophasic specimens, $SrCuO_2$, $Ca_2CuO_3$, $BiVO_4$, $Bi_2CuO_4$ as well as $(Tl_{0.5}Pb_{0.5})Sr_2(Ca_{0.8}Y_{0.2})Cu_2O$ (Liang, J. M. et al, Physica C 165, 347–353 (1990), have been used as standard materials in the EDS analysis. Selected area electron diffraction (SAED) patterns recorded from the same electron microscope have been used to confirm the unit cell parameters. Electron spin resonance (ESR) spectra were recorded between about 77K and room-temperature using a Bruker ER200D X-band spectrometer, with 100 KHZ field modulation and $TE_{102}$ rectangular microwave resonator. This incorporated either a commercial variable temperature attachment or a quartz insert Dewar containing nitrogen.

Figure 1:
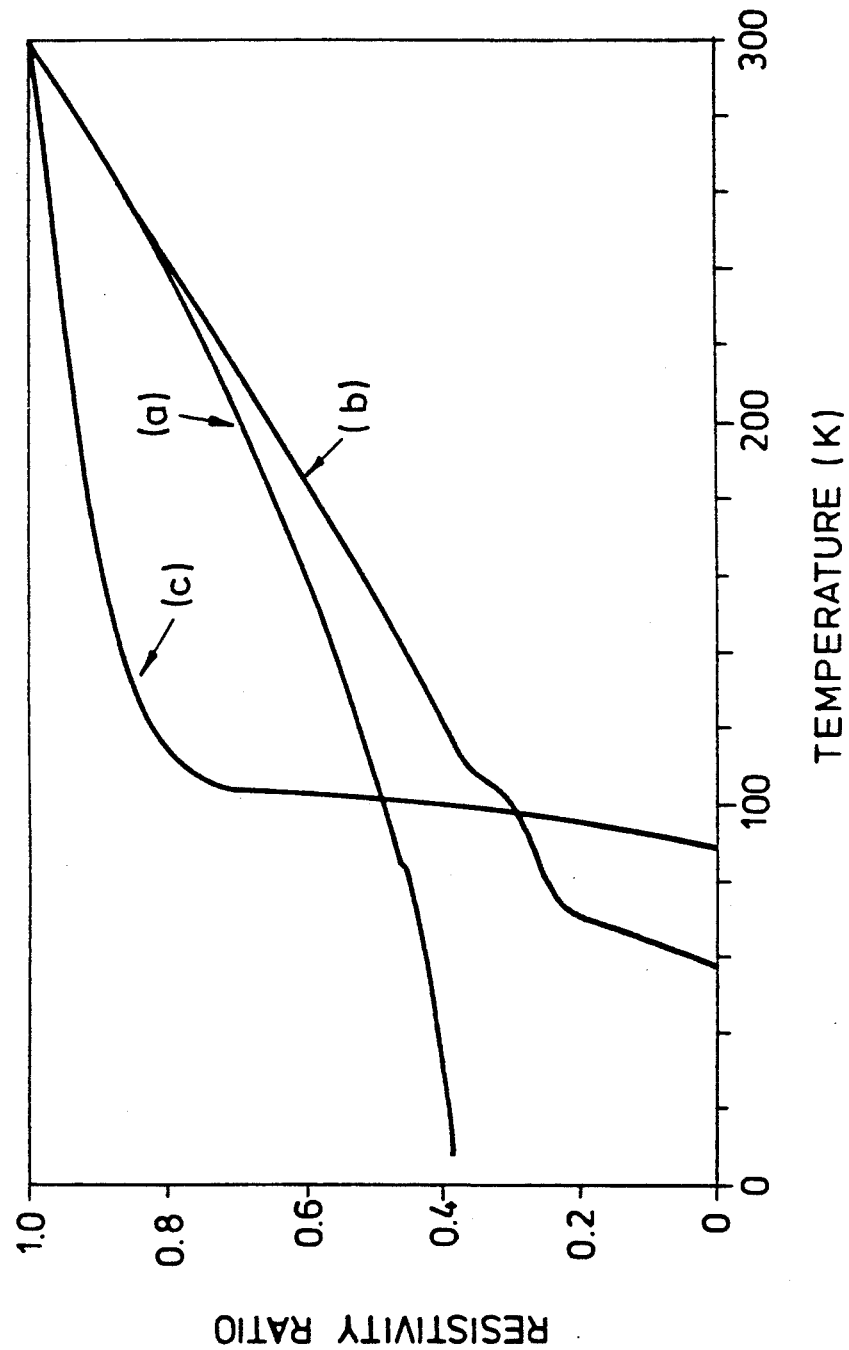
FIG. 1 is a graph showing temperature dependence of the normalised resistivity (expressed as a ratio to the resistivity at 300K) for selected samples of superconductors in accordance with the invention and some known superconductors for comparison.

FIG. 1 shows the temperture dependence of the (normalised) electrical resistivity for samples with nominal compositions of $TlSr_2CaCu_2O_y$ (a), $(Tl_{0.5}V_{0.5})Sr_2CaCu_2O_y$ (b) and $(Tl_{0.5}V_{0.5})Sr_2(Ca_{0.8}Y_{0.2})Cu_2O_y$ (c). The $TlSr_2CaCu_2O_y$ sample has a room temperature resitivity (300K) of 7.15 milliohm cm and clearly exhibits a metallic behaviour down to 4K except for a very small (but reproducible) resistivity drop around 84K, as shown in FIG. 1(a). This anomaly at 84K may arise from a small amount of superconducting phase present in this sample. The $(Tl_{0.5}V_{0.5})Sr_2CaCu_2O_y$ sample [FIG. 1(b)] displayed a characteristic metallic behaviour in the normal state (resitivity at 300K about 3.2 milliohm cm) and had a two-step resistivity drop at 110K and 80K, and $T_{c(zero)} = 57K$. Interestingly, the $(Tl_{0.5}V_{0.5})Sr_2CaCu_2O_y$ sample possessed the largest room temperature resistivity (17.4 milliohm cm) at 300K but also has the highest superconducting transition temperature, with $T_{c(zero)} = 87K$ (FIG. 1 (c)).

Figure 2:
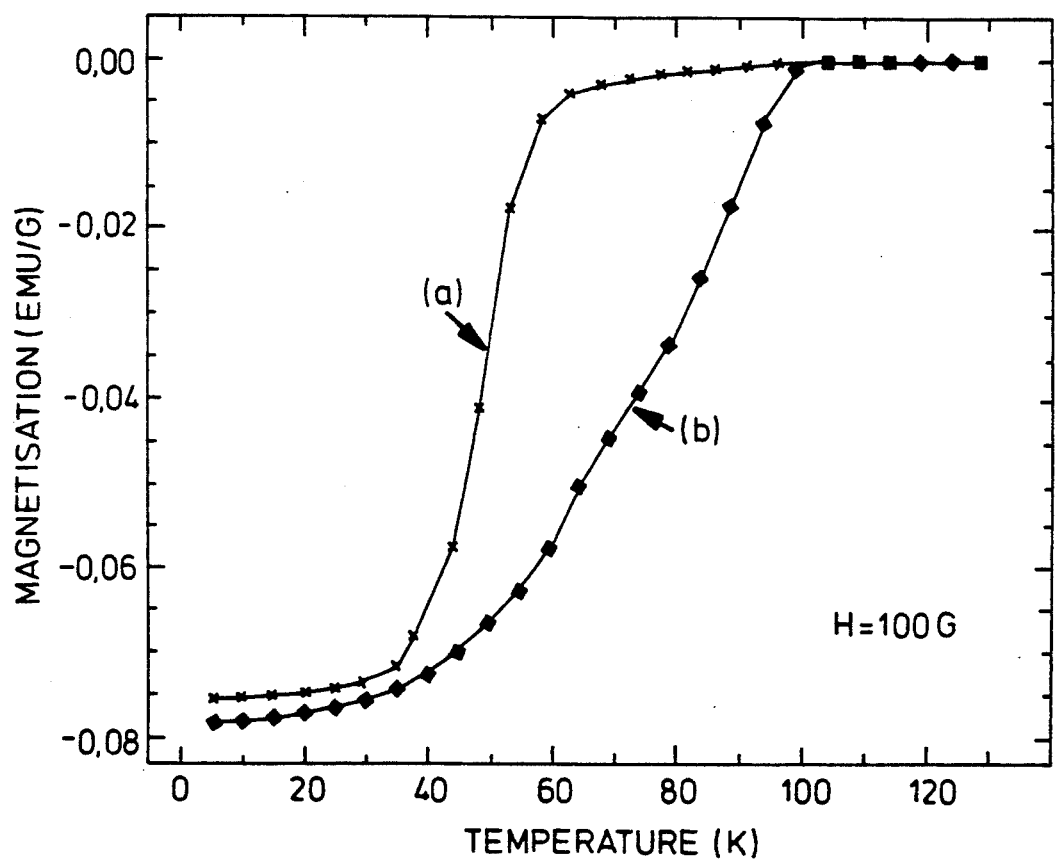
FIG. 2 shows field cooled (FC) magnetisation versus temperature for selected superconductors in accordance with the invention in 100 gauss applied magnetic field.

FIG. 2 shows the results of field cooled measurements of the dc magnetisation in an applied field of 100 gauss on the samples $(Tl_{0.5}V_{0.5})Sr_2CaCu_2O_y$ (a) and $(Tl_{0.5}V_{0.5})Sr_2(Ca_{0.8}Y_{0.2})Cu_2O_y$ (b). The field-cooled curve of $(Tl_{0.5}V_{0.5})Sr_2CaCu_2O_y$ [FIG. 2(a)] indicated a very small, but real, diamagnetic signal at 105K together with a large diamagnetic signal at 60K. Both features are consistent with the two-step electrical resistivity drop as shown in FIG. 1(b). The magnetisation measurement (field-cooled) of the sample $(Tl_{0.5}V_{0.5})Sr_2(Ca_{0.8}Y_{0.2})Cu_2O_y$ indicated a diamagnetic response at 105K which is consistent with the electrical resistivity result [FIG. 1(c)].

The X-ray diffraction pattern of $TlSr_2CaCu_2O_y$ sample revealed predominantly an unidentified phase with a small amount of the superconducting $TlSr_2CaCu_2O_y$ (1-2-1-2) phase (Nagashima, T. et al Jpn J Appl Phys 27 L1077–L1079 (1988); Sheng, Z. Z. et al Phys Rev B38, 7074–7076 (1988)). However, when Tl and Ca were partially substituted by Pb and Y respectively single-phase $(Tl_{0.5}Pb_{0.5})Sr_2(Ca_{0.8}Y_{0.2})Cu_2O_y$ was detected [FIG. 3(a)].

Figure 3:
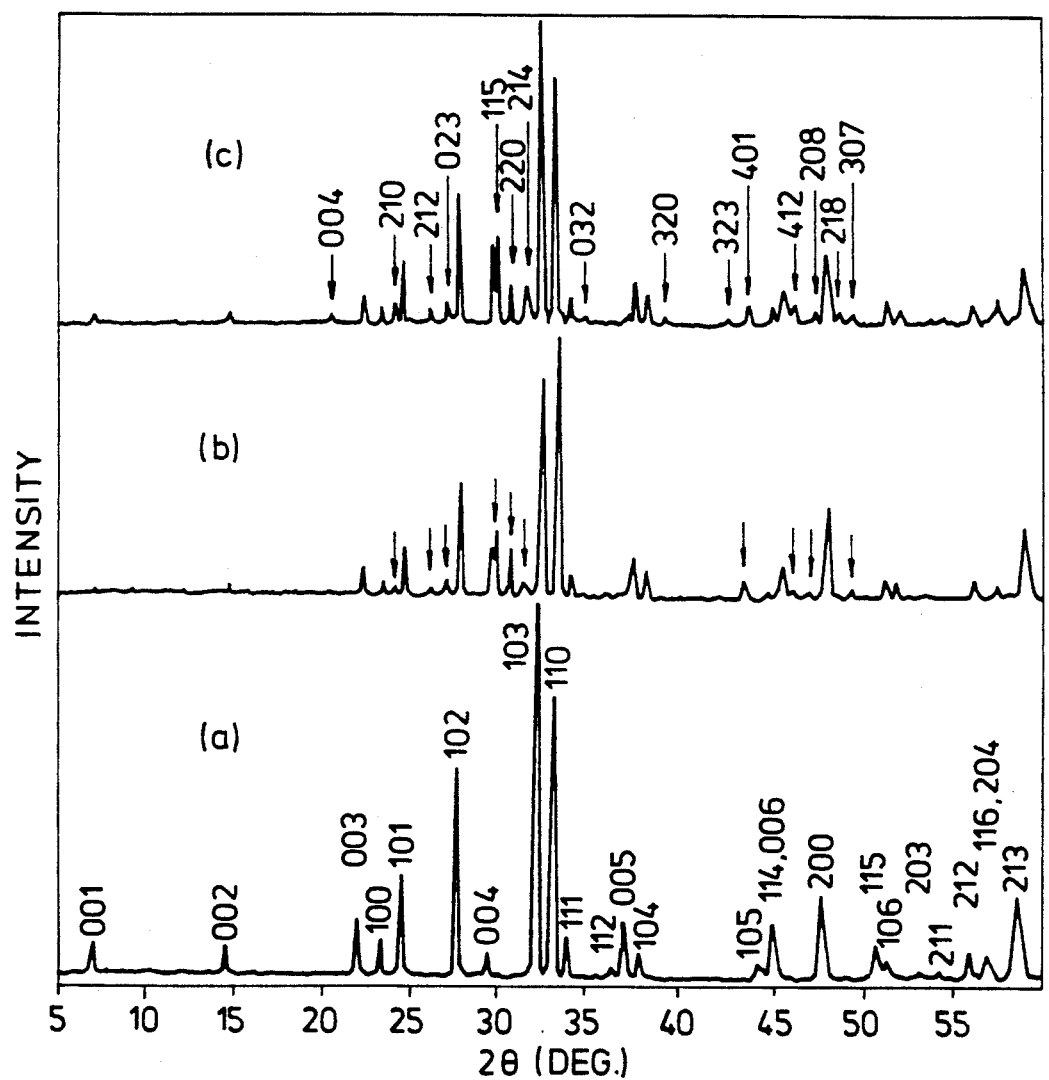
FIG. 3 shows X-ray diffraction patterns of selected superconductor compositions.

Importantly, in the present example, when V cations were introduced into Tl sites, the 1-2-1-2 phase was stabilized. FIG. 3 shows the powder X-ray diffraction patterns of the vanadium-containing samples with nominal compositios $(Tl_{0.5}V_{0.5})Sr_2CaCu_2O_y$ (b) and $(Tl_{0.5}V_{0.5})Sr_2(Ca_{0.8}Y_{0.2})Cu_2O_y$ (c) compared to the pattern of monophasic $(Tl_{0.5}Pb_{0.5})Sr_2(Ca_{0.8}Y_{0.2})Cu_2O_y$ (a). Almost all of the strong peaks in the XRD pattern of the $(Tl_{0.5}V_{0.5})Sr_2CaCu_2O_y$ sample [FIG. 3(b)] can be indexed on the basis of the $TlBa_2CaCu_2O_y$ likely structure (Parkin, S. S. P. et al Phys. Rev B38 6531–6537 (1988)) structure having the tetragonal unit cell (P4/mmm) and lattice parameters $a = 3.791 Å$ and $c = 11.916 Å$. These lattice parameters are slightly smaller than the corresponding $(Tl_{0.5}Pb_{0.5})Sr_2CaCu_2O_y$ system $[a = 3.8023(3) Å$ and $c = 12.107(1) Å]$ (Parise, J. B. et al Physica C 156, 245–254 (1988)), probably as a result of the effects of the substitution of vanadium. We have attempted the substitution of 20% of $Y^{3+}$ ions on $Ca^{2+}$ sites in the $(Tl_{0.5}V_{0.5})Sr_2CaCu_2O_y$ compound; the X-ray diffraction pattern of the resulting $(Tl_{0.5}V_{0.5})Sr_2(Ca_{0.8}Y_{0.2})Cu_2O_y$ phase is given in FIG. 3(c). A contraction of lattice parameter c by 0.46% and expansion of the lattice parameter a by 0.10% was observed for $(Tl_{0.5}V_{0.5})Sr_2(Ca_{0.8}Y_{0.2})Cu_2O_y$ as compared to the lattice parameters of $(Tl_{0.5}V_{0.5})Sr_2CaCu_2O_y$. This reduction in the lattice parameter c probably arises from the differences in ionic radii between the $Y^{3+}$ ion (0.93Å) and the $Ca^{2+}$ ion (0.99Å) and the expansion in the a lattice parameter a is attributed to a decrease in the average copper oxidation state, leading to larger Cu-O distances within the copper/oxygen sheets. A similar effect has been observed in earlier studies of $Bi_2(Sr_{3-x}Y_x)Cu_2O_{8+delta}$ (Subramanian, M. A. et al J. Solid State Chem. Vol177 pp196ff (1988)), $BiSr_2(Ca_{1-x}Y_x)Cu_2O_{8+delta}$ and $TlBa_2(Ca_{1-x}Y_x)Cu_2O_{7-delta}$.

Figure 4:
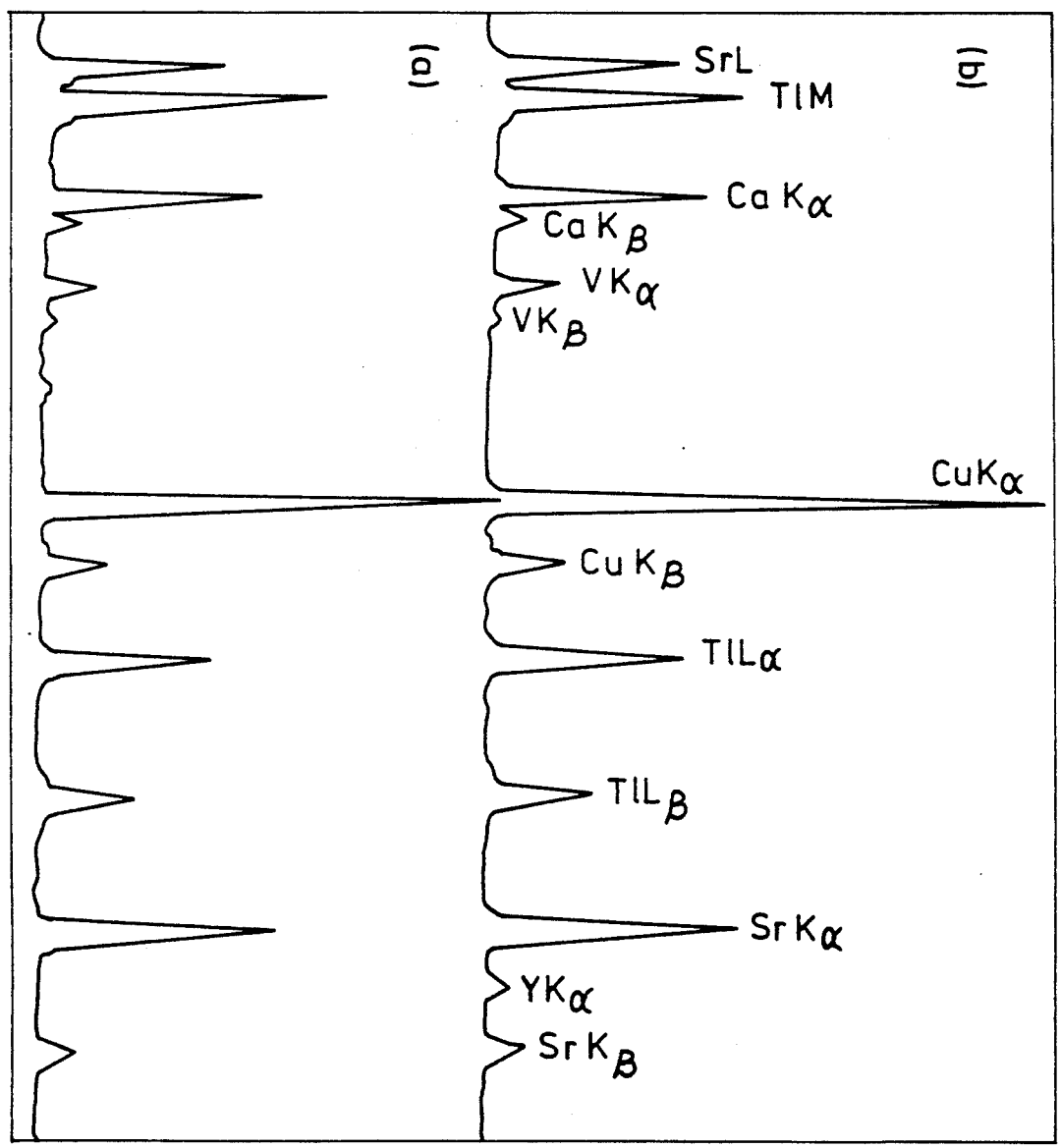
FIG. 4 is an energy dispersion spectrum for samples of selected superconducting compositions.

Compositions o individual single microcrystals in the prepared specimens, $(Tl_{0.5}V_{0.5})Sr_2CaCu_2O_y$ and $(Tl_{0.5}V_{0.5})Sr_2(Ca_{0.8}Y_{0.2})Cu_2O_y$, have been examined using energy dispersive spectrometry. Thirty particles in each sample were randomly chosen. The majority phases in both samples were determined to be $[Tl_{0.72(4)}V_{0.28(4)}]Sr_{2.1(1)}Ca_{1.04(8)}Cu_2O_y$ and $[l_{0.7(6)}V_{0.27(4)}]Sr_{1.95(9)}[Ca_{0.86(7)}Y_{0.14(3)}]Cu_2O_y$, respectively as shown in FIG. 4. Both compositions fit the 1-2-1-2 phase very well. The composition of the main impurity phase in both the samples was determined by energy dispersive spectrometry to be close to $Sr(V_{0.7}Cu_{0.2}Ca_{0.1})O_y$.

Selected area electron diffraction patterns for both the 1-2-1-2-like phase and the impurity phase have been recorded through tilting the specimen stage. We were able to confirm the unit cell Parameters of the 1-2-1-2 phase and determine the unit cell for the Sr, V-rich impurity phase (orthorhombic, with $a = 8.35Å$, $b = 8.04Å$ and $c = 17.36Å$). Using this data we have successfully indexed all extra peaks in FIG. 3(b) and 3(c). Although the detailed structure of this phase is not understood yet, we assume that the structure is probably related to pyrochlore type, say $Sr_2[V_{1-x}(Cu, Ca)_x]_2O_{7-8}$ and the unit cell shows a root 2 X root 2 X 3 superstructure based on the pyrochlore lattice.

Figure 5:
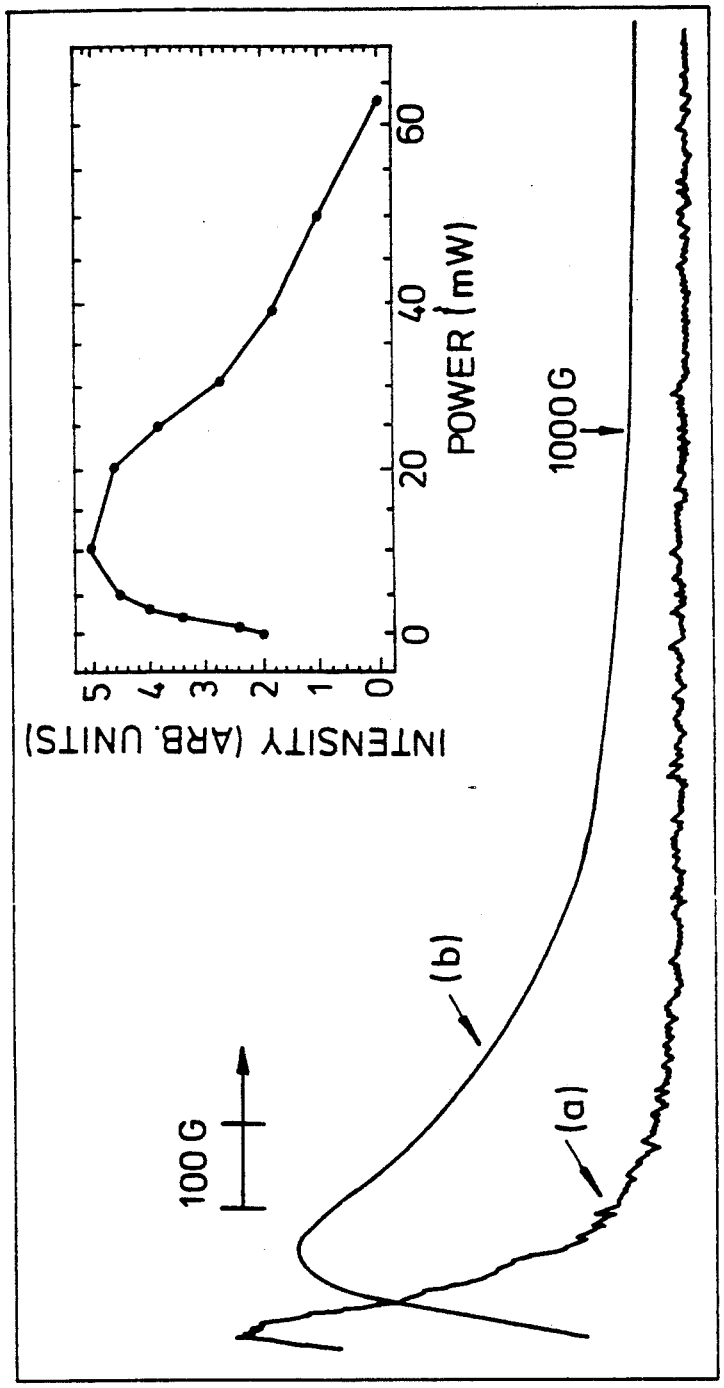
FIG. 5 is a graph of modulated low-field microwave absorption measured at 77K for selected composition in accordance with the invention.

Electron-spin resonance spectra of the two vanadium-containing superconducting phases with nominal compositions $(Tl_{0.5}V_{0.5})Sr_2CaCu_2O_y$ and $(Tl_{0.5}V_{0.5})Sr_2Ca_{0.8}Y_{0.2}Cu_2O_y$ were measured between room-temperature and 77K, with a view to probing the valence state of the vanadium ions. The synthetic conditions (see earlier), would almost certainly decompose $V_2O_5$ to produce $V_2O_3$ and/or $VO_2$. The electron-spin resonance spectra of localised $V^{4+}$ $(3d^1)$, $V^{3+}(3d^2)$ and $V^{2+}(3d^3)$ have all been extensively investigated. However, neither superconducting phase gave an electron-spin resonance signal. The $V^{3+}$ ion has been previously detected as a dopant in $Al_2O_3$ (Lambe, J, Kikuchi, C. Phys. Rev. vol 118 pp71–77 (1960)). It is characterised by a very large spin-lattice relaxation rate (a consequence of strong spin-orbit coupling and accessible, low-lying excited states) meaning the spectrum could only be observed at liquid helium temperatures. Clearly, low temperatures are required to probe the valence state of vanadium via electron-spin resonance, and in this regard, we were hampered by the appearance of a intense low-field microwave absorption that appeared on cooling the sample through $T_c$. This response is characteristic of the superconducting state and has been widely studied. FIG. 5 shows the low-field microwave absorption from both samples at 77K, the signal from $(Tl_{0.5}V_{0.5})Sr_2(Ca_{0.8}Y_{0.2})Cu_2O_y$ (b) being significantly more intense and broader than that from $(Tl_{0.5}V_{0.5})Sr_2CaCu_2O_y$ (a), equivalent quantities of material being used in each case. The variation in the signal intensity of $(Tl_{0.5}V_{0.5})Sr_2CaCu_2O_y$ as a function of microwave power is also shown as inset in FIG. 5; the signal exhibits an intial enhancement followed by saturation-type effect as the microwave power is raised, the latter being accompanied by a significant detuning of the microwave bridge.

EXAMPLE 2

The synthetic procedure set out in Example 1 was used to prepare compositions of the formula $(Tl_{0.5}M_{0.5})Sr_2(Ca_{0.8}Y_{0.2})CuO_{7-delta}$ for $M = Ti, Zr, Hf, Nb$ and $Ta$. Resistivity measurements were made in a similar manner and are plotted FIG. 6. Curve (b) is for $M = Ti$, curve (c) for $Zr$, curve (d) for $Hf$, curve (e) for $Nb$ and curve (f) for $Ta$; curve (a) is a comparison curve for the prior-art composition $(TlSr_2(Ca_{0.8}Y_{0.2})Cu_2O_{7-delta}$, and it will be observed that all the substitutions result in increased $T_c$ compared with the prior art. There is no reason to believe that the compositions of this Example are optimum compositions for any of the metals M.

EXAMPLE 3

Various compositions of formula Tl-Cr-Sr-Ca-Cu-O were prepared from high purity $Tl_2O_3, Cr_2O_3, SrCO_3$ and $CaCO_3$, CaO and CuO which were mixed, ground, and heated at 900° C.–950° C. for about 24 hours with intermediate grinding to obtain uniform powders. These were pressed into pellets and heated for 5–15 minutes in an alumina crucible under a steam of oxygen. The furnace was cooled gradually to 850° C. and that temperature was maintained for 8–24 hours before cooling to ambient temperatures.

The products were characterised as having a high proportion of 1-2-1-2 phase and $T_c$'s in the range 100–110K.

(Examples 1 and 2 were conducted by the inventors at the Interdisciplinary Research Centre in Superconductivity, University of Cambridge and Example 3 has been reported by Sheng et al (Superconductor Week Feb. 4, 1991 page 2) working independently).

what we claim as our invention is:

1. A superconducting material having a stoichiometric formula $(Tl_w, In_{1-w})_{1-x} M_x Sr_2 (Ca_{1-y} M'_y) Cu_2 O_z$, in which W is in the range from 0 to 1 inclusive of both limits, x is greater than 0 but less than 1, y is in the range from 0 to 1 inclusive of both limits, and z is about 7, M is selected from the group consisting of V, Ti, Cr, Zr, Nb, Hf, Ta, Mn, Fe, Co, Ni, W, Os, or Ir, and M' is selected from the group consisting of Y and the rare earth elements.

2. A material according to claim 1 having the stoichimetric formula $(Tl_{1-x}M_x)Sr_2(Ca_{1-y}M'_y)Cu_2O_z$, in which $0 < x < 1$ and $0 < y < 1$ and z is about 7.

3. A material according to claim 2 in which $0.15 < x < 0.60$.

4. A material according to claim 3 in which x is about 0.28.

5. A material according to claim 2 in which $1 < y < 0.5$.

6. A material according to claim 1 in which M is V.

7. A material according to claim 1 in which M is selected from the group consisting of Ti, Cr, Zr, Nb, Hf and Ta.

8. A material according to claim 1 in which M is Cr.

* * * * *